(12) United States Patent
Lee (10) Patent No.: US 7,687,846 B2
(45) Date of Patent: Mar. 30, 2010

(54) NONVOLATILE MEMORY DEVICE (75) Inventor: Wook-Hyoung Lee, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 574 days.

(21) Appl. No.: 11/561,019

(22) Filed: Nov. 17, 2006

(65) Prior Publication Data
US 2007/0128798 A1 Jun. 7, 2007

(30) Foreign Application Priority Data
Dec. 7, 2005 (KR) ............ 10-2005-0118897

(51) Int. Cl.
H01L 21/336 (2006.01)
(52) U.S. Cl. .................... 257/315; 438/258
(58) Field of Classification Search ............. 257/315; 438/258
See application file for complete search history.

(56) References Cited

U.S. PATENT DOCUMENTS 6,072,212 A 6/2000 Kaya et al.
6,180,456 B1 * 1/2001 Lam et al. ............ 438/258
6,635,532 B2 * 10/2003 Song et al. ........... 438/259
2005/0074925 A1 4/2005 Kim et al.

FOREIGN PATENT DOCUMENTS

KR 1019990016850 A 3/1999
KR 10-2005-0032444 A 4/2005
KR 10-2005-0032445 A 4/2005

* cited by examiner

Primary Examiner—Douglas M Menz
(74) Attorney, Agent, or Firm—Myers Bigel Sibley & Sajovec (57) ABSTRACT Disclosed are nonvolatile memory devices and methods of fabricating the same. A nonvolatile memory device can include a field isolation film configured to define active regions in a substrate and a wordline configured to intersect the active regions. Devices can also include source and drain regions formed in each of the active regions at both sides of the wordline and a source line configured to extend along the wordline under the source region. Devices can further include a join region configured to connect the source region with the source line.

7 Claims, 8 Drawing Sheets

NONVOLATILE MEMORY DEVICE

CROSS-REFERENCE TO RELATED APPLICATIONS

This application claims priority under 35 U.S.C. § 119 to Korean Patent Application 10-2005-118897 filed in the Korean Intellectual Property Office on Dec. 7, 2005, the disclosure of which is incorporated herein in its entirety by reference.

BACKGROUND

The present invention relates to semiconductor devices, and more particularly to nonvolatile memory devices and methods of fabricating the same.

In general, semiconductor memory devices can be classified into volatile and nonvolatile types. Nonvolatile memory devices, including dynamic random access memories (DRAMs) and static random access memories (SRAMs), can be conducive in fast data input/output operation, but will lose their data when there is no power supply. On the contrary, the nonvolatile memory devices can retain their data even without power supply.

Flash memory devices, which are a generally classified as nonvolatile memory devices, are highly integrated devices that can have the merits of erasable and programmable read-only memories (EPROMs) and electrically EPROMs.

The flash memory devices are generally distinguished into NOR and NAND types. A NOR-type flash memory can be operable at high frequencies since the memory cells can be controlled independently. A NOR-type flash memory device, however, is larger than that of NAND-type memory device because a bitline contact is required for each pair of memory cells.

Many techniques have been proposed to address the shortcomings of the NOR-type flash memory. For example, self-aligned source line (SAS) and shallow trench isolation (STI) techniques can be useful to reduce memory cell sizes in the bitline and wordline directions, respectively. These techniques can be currently used in the fabrication of NOR-type flash memory devices.

However, with a reduction of the size of memory cells, the SAS resistance can increase substantially. In addition, as trenches are deepened using a high internal voltage in the flash memory device, the SAS resistance can increase further. While an increasing concentration of impurities can be injected into the SAS to overcome this effect, the memory device may experience reduced reliability due to a channel length shortening, which can cause a punch-through effect.

SUMMARY

Embodiments of the present invention provide nonvolatile memory devices and methods of fabricating the same. In this regard, some embodiments can be implemented as methods that include forming a field isolation film to define an active region in a semiconductor substrate and forming a wordline to intersect the active region. Such methods can also include injecting first impurities into the active region at a first side of the wordline and removing the field isolation film from the first side of the wordline to expose the semiconductor substrate. Such methods can further include injecting second impurities into the active region and the exposed semiconductor substrate at the first side of the wordline to form a source line, a source region, and a join region to connect the source line with the source region.

In some embodiments, the first impurities may be germanium ions. In other embodiments, the first impurities may be implanted in depth of 200~500 Å.

In yet other embodiments, the second impurities may be N-types in conductivity. In some embodiments, the N-types may include phosphorous (P) ions.

In further embodiments, the source line may be formed under the source region. The source line of some embodiments can have a bottom lower than the bottom of the field isolation film.

In yet further embodiments, methods may also include forming a photoresist pattern that exposes the first side of the wordline and covers a second side of the wordline, before injecting the first impurities. In addition, some methods may also include removing the photoresist pattern after injecting the second impurities and injecting third impurities into the active region to form a drain region. Yet other embodiments can include injecting the third impurities into the source line, the source region, and the active region. In some embodiments, the third impurities may be N-types in conductivity, such as arsenic (As) ions.

In methods of some other embodiments, a protection film may be formed to cover the source and drain regions by thermal treatment after injecting the third impurities. In some embodiments, the thermal treatment may be carried out in atmosphere of oxygen with temperature of 800~1000 degrees Celsius.

In yet other embodiments, a nonvolatile memory includes a low resistance source line.

According to some embodiments, a nonvolatile memory device includes a field isolation film configured to define multiple active regions in a substrate, a wordline that intersects the active regions, and a source region and a drain region that are formed in each of the active regions at both sides of the wordline. The device of some embodiments also includes a source line that extends along the wordline under the source region and a join region that connects the source region with the source line.

In some embodiments, the nonvolatile memory device may further include an isolation region enclosed by the source region, the join region, and the source line.

In other embodiments, the source line includes a bottom that is lower than the bottom of the field isolation film.

In yet other embodiments, the source region may include at least two types of impurities. In some embodiments, the source region and the source line may include different quantities of types of impurities. In some other embodiments, the source region includes germanium ions and the source line excludes germanium ions.

According to some embodiments, a nonvolatile memory device includes field isolation films configured to define multiple active regions in a substrate and multiple wordlines configured to intersect the active regions and the field isolation films. The device of some embodiments also includes source and drain regions that are formed in each of the active regions at both sides of the wordlines and source lines configured to extend along the wordlines under the source regions at the sides of the wordlines. The device of some embodiments further includes join regions configured to connect the source regions with the source lines.

BRIEF DESCRIPTION OF THE FIGURES

FIGS. 3A through 7A are partial cross-sectional views, taken along with A-A' of FIG. 1, illustrating methods for fabricating a nonvolatile memory device according to some embodiments of the invention.

FIGS. 3B through 7B are partial cross-sectional views, taken along with B-B' of FIG. 1, illustrating methods for fabricating a nonvolatile memory device according to some embodiments of the invention.

DETAILED DESCRIPTION

Embodiments of the present invention will be described below in more detail with reference to the accompanying drawings, in which embodiments of the invention are shown. The present invention may, however, be embodied in different forms and should not be constructed as limited to the embodiments set forth herein. Rather, these embodiments are provided so that this disclosure will be thorough and complete, and will fully convey the scope of the invention to those skilled in the art.

In the figures, the dimensions of layers and regions are exaggerated for clarity of illustration. It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present. Like reference numerals refer to like elements throughout.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
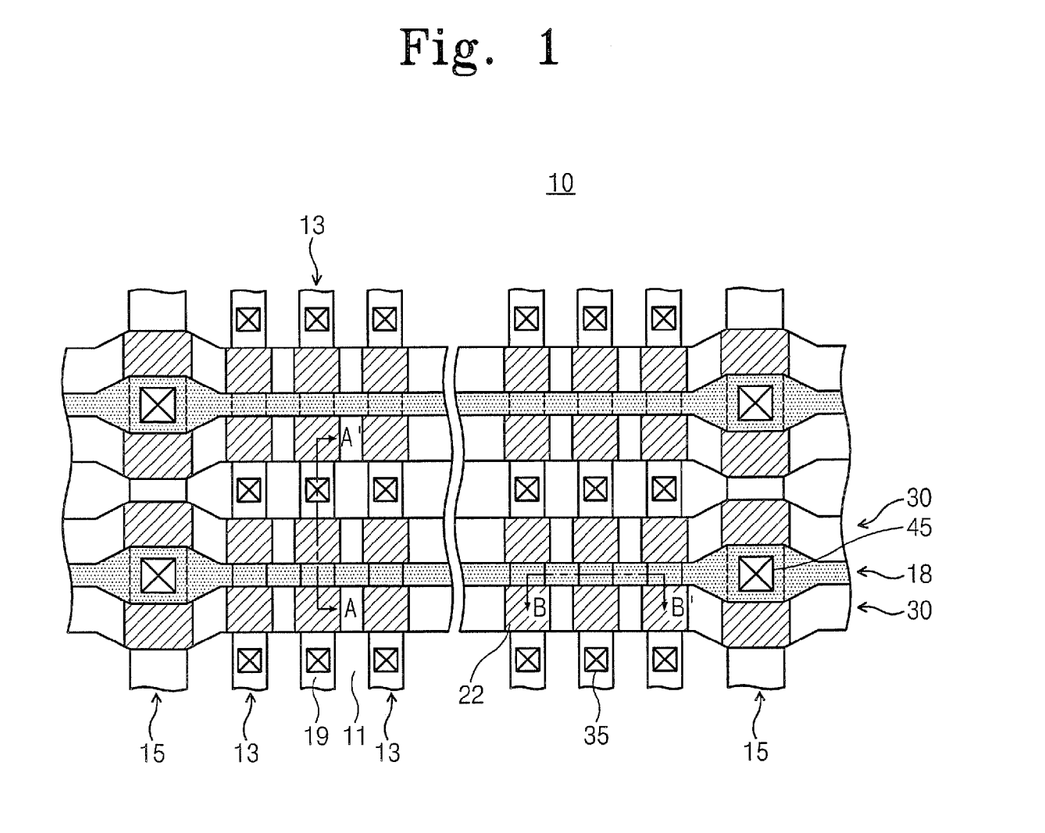
FIG. 1 is a plan view illustrating a cell array of a nonvolatile memory device according to some embodiments of the invention.
Figure 2A:
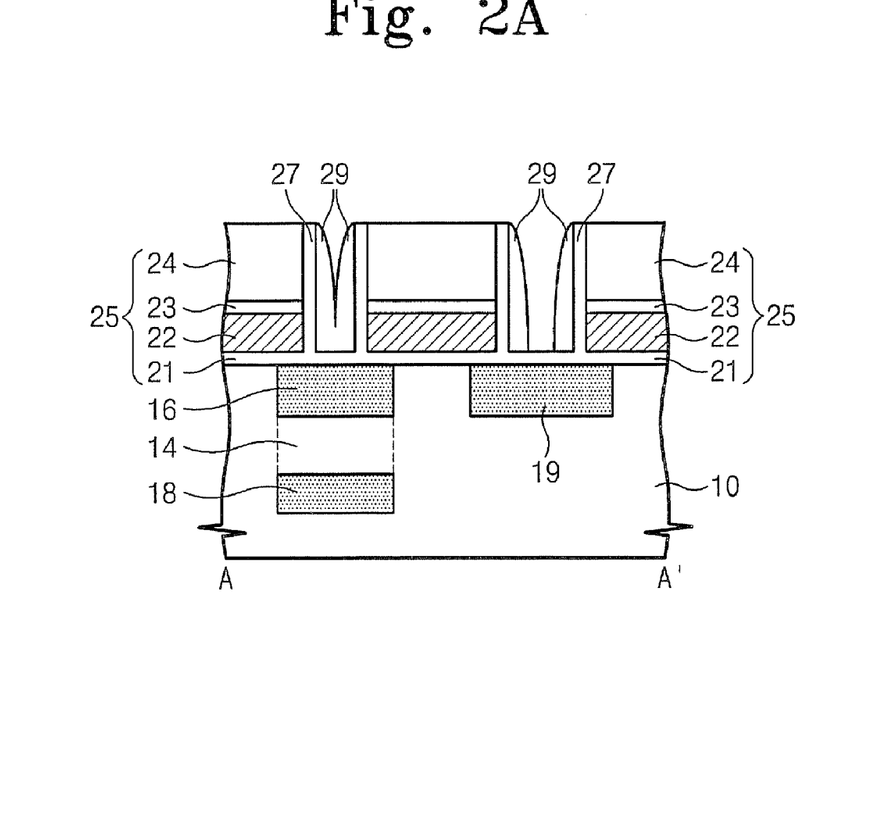
FIG. 2A is a partial cross-sectional view taken along with A-A' of FIG. 1 according to some embodiments of the invention.
Figure 2B:
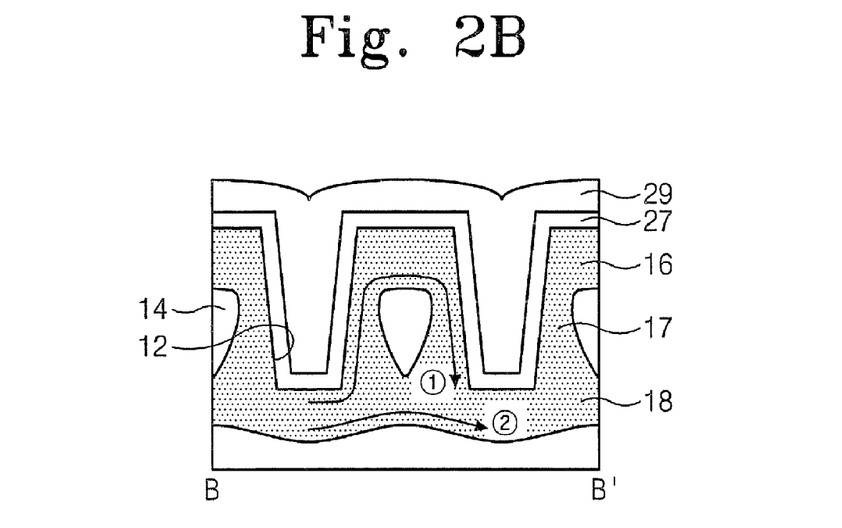
FIG. 2B is a partial cross-sectional view taken along with B-B' of FIG. 1 according to some embodiments of the invention.
Figure 2C:
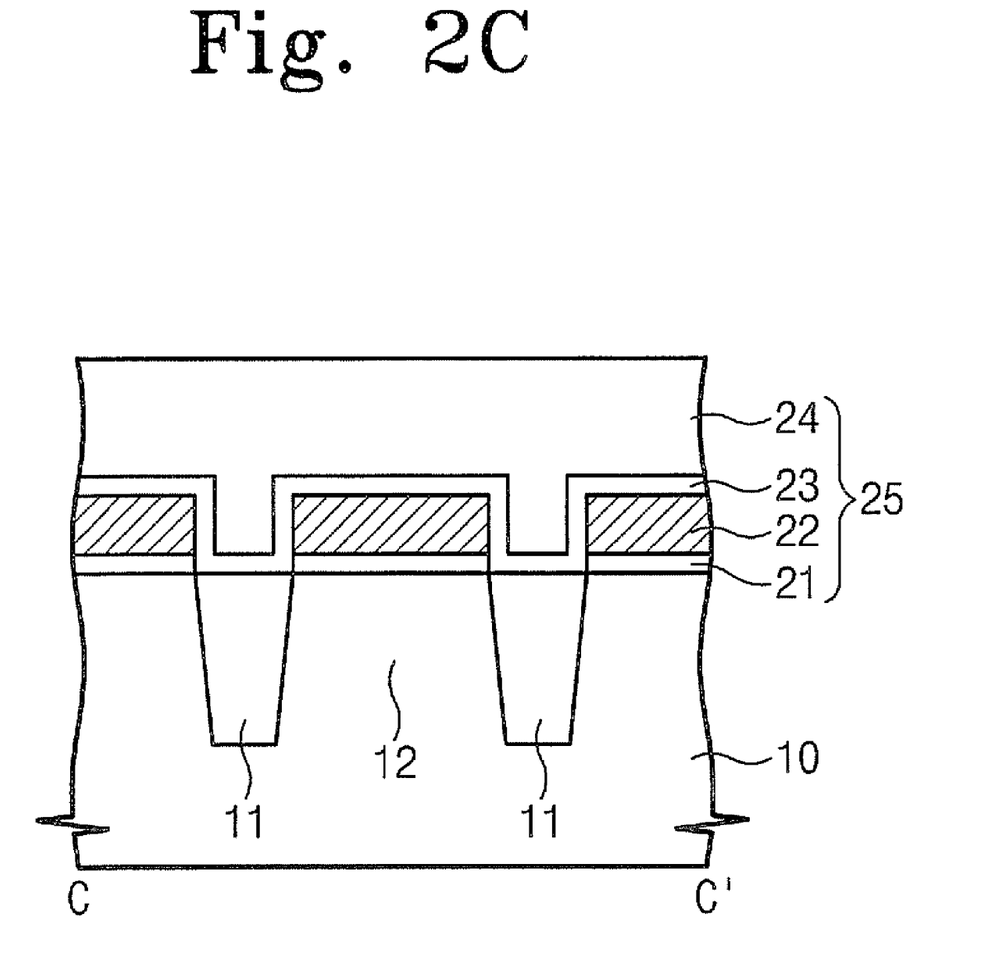
FIG. 2C is a partial cross-sectional view taken along with C-C' of FIG. 1 according to some embodiments of the invention.

Reference is made to FIG. 1, which is a layout view illustrating a cell array of a nonvolatile memory device in accordance with some embodiments of the invention and FIGS. 2A through 2C, which illustrate sections of a nonvolatile memory device as shown in FIG. 1. Specifically, FIG. 2A is a sectional view taken along with A-A' of FIG. 1, FIG. 2B is a sectional view taken along with B-B' of FIG. 1, and FIG. 2C is a sectional view taken along with C-C' of FIG. 1.

Referring to FIGS. 1, 2A, 2B, and 2C, field isolation films 11 are formed in a substrate 10, defining multiple cell active regions 13 and multiple source active regions 15, which are arranged in parallel with each other. Multiple wordlines 30 can be arranged along a direction intersecting the active regions 13 and 15. Source and drain regions 16 and 19 are each disposed in the cell active regions 13 at both sides of the wordline 30.

Self-aligned source (SAS) lines 18 are disposed at sides of the wordlines 30. In some embodiments two of the wordlines 30 share one of the source lines 18. The source lines 18 may be located at the bottoms of trenches 12 from which the field isolation films 11 can be removed. The source regions 16 can be conductively connected to the source lines 18 through join regions 17. Thus, isolation regions 14 may be formed that are enclosed by the source regions 16, the join regions 17, and/or the source lines 18. The source lines 18 can be conductively connected through source contacts 45 to a common source line (not shown) that is disposed over the source active regions 15. In some embodiments, the common source line is grounded through an external connection. The drain regions 19 can be connected through bitline contacts 35 to bitlines (not shown) that can be placed over the cell active regions 13.

The source regions 16, the join regions 17, the source lines 18, and the drain regions 19 may be different in impurities implanted therein. For instance, germanium (Ge) ions may be implanted into the source regions 16, while phosphorous (P) ions may be implanted into the source regions 16, the join regions 17, and the source lines 18. By controlling the impurities implanted according to these exemplary patterns, it is possible to form the source lines 18 under the source regions 16 without extending the area of the source regions 16. In this manner, a short channel effect can be produced between the source and drain regions 16 and 19, which can reduce resistance at the source lines 18.

Referring to FIG. 2A, gate structures 25 can each include a tunnel insulation film 21, a floating gate 22, a dielectric film 23, and a control gate 24, on the active regions 13 and 15. The gate structure 25 may further include a hard mask pattern (not shown) placed on the control gate 24. In some embodiments, the tunnel insulation film 21 may be formed of silicon oxide, and the floating gate 22 may be formed of doped polysilicon. The dielectric film 23 may be formed of oxide-nitride-oxide (ONO), and the control gate 24 may be formed of a stacked layer with doped polysilicon and silicide.

The floating gates 22 can be isolated from each other conductively and/or spatially and the control gates 24 can be connected with each other to form the wordline 30. In some embodiments, each of the floating gates 22 can function as a charge storage element. For example, electrons can be accumulated in the floating gate 22 using hot electron injection during a programming operation. The electrons can be released from the floating gate 22 by virtue of a Fowler-Nordheim tunneling effect during an erasing operation. During a read operation, the presence of electrons in the floating gate 22 can be identified, i.e., a data storage state, by detecting cell current flow from the drain region 19 toward the source region 16. When the cell current flows in this manner, charges (electrons or holes) move through the source line 18.

Referring now to FIG. 2B, in a conventional nonvolatile memory device, the source line can include large resistance since charges have to pass through the source region 16 and an alternate path is not provided. Along with reducing the size of the memory cell through a narrower width of the source line 18 and a larger depth of the trench 12, the resistance of the source line 18 increases. Thus, cells spaced more distant from the source active region 15 can have smaller cell currents. Based on a large difference of cell currents between a distant memory cell and a nearby memory cell, the reliability of the memory device may be reduced without an additional current path (i.e., the second path), through which charges move under the SAS line 18. In this manner, the resistance of the source line 18 can be reduced. Further, the distribution of cell currents can be generally independent of cell positions.

In some embodiments, the nonvolatile memory device according to the invention may also include a protection film 27 covering sidewalls of the gate structures 27, the source lines 18, and the drain regions 19. Spacers 29 can also be included that cover the sidewalls of the gate structures 25 and the source lines 18. By way of example, the protection film 27 may be made of silicon oxide, and the spacers 29 may be made of silicon nitride.

Reference is now made to FIGS. 3A through 7A and 3B through 7B, which are sectional views illustrating methods for fabricating a nonvolatile memory device according to some embodiments of the invention. FIGS. 3A through 7A illustrate views taken along lines A-A' of FIG. 1 and FIGS. 3B through 7B illustrate views taken along lines B-B' of FIG. 1.

Figure 3A:
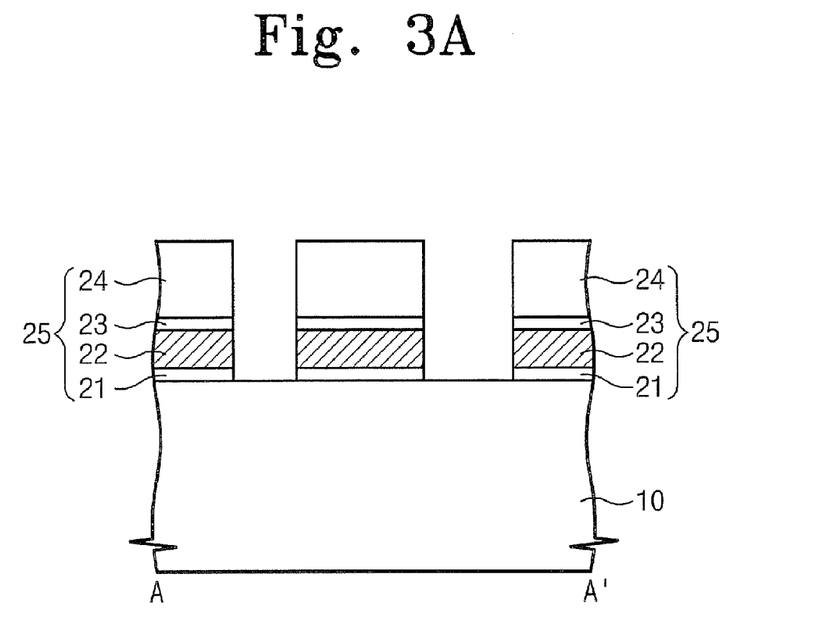
Figure 3B:
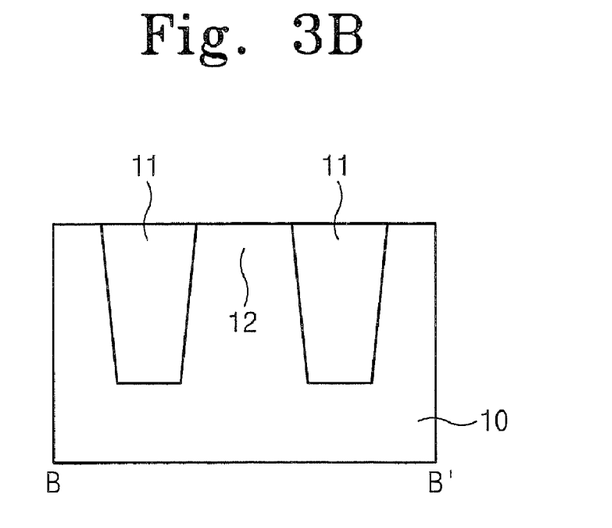

Field isolation films 11 can be formed in the substrate 10, defining the active regions 12. The field isolation films 11 may be formed of an insulating material, e.g., silicon oxide, using, for example, an STI process. Gate structures 25 can be formed on the active regions 12 and can each include a tunnel insulation film 21, a floating gate 22, a dielectric film 23, and a control gate 24 that can be stacked in sequence. The tunnel insulation film 21, the floating gate 22, the dielectric film 23, and the control gate 24 may be formed using known processes for film formation. For example, the tunnel insulation film 21 may be formed of silicon oxide using thermal oxidation, and the floating gate 22 may be formed of doped polysilicon using plasma-enhanced chemical vapor deposition (PECVD). The dielectric film 23 may be formed of ONO using PECVD or atomic layer deposition (ALD). The control gate 24 may be formed of doped polysilicon, or a stacked structure with doped polysilicon and metal silicide, using PECVD.

Figure 4A:
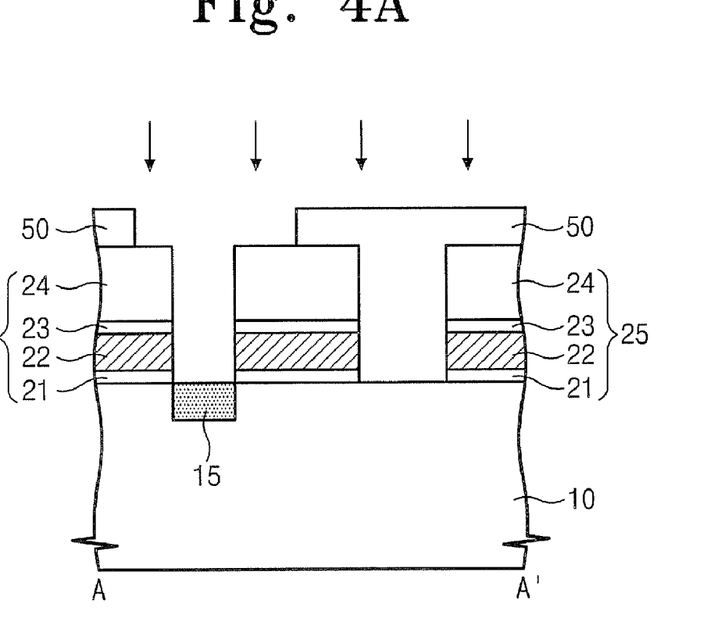
Figure 4B:
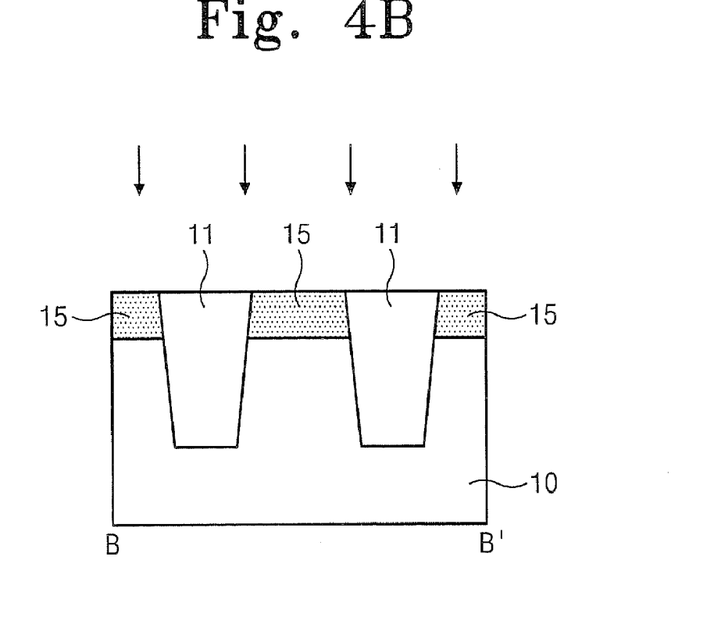
Figure 6A:
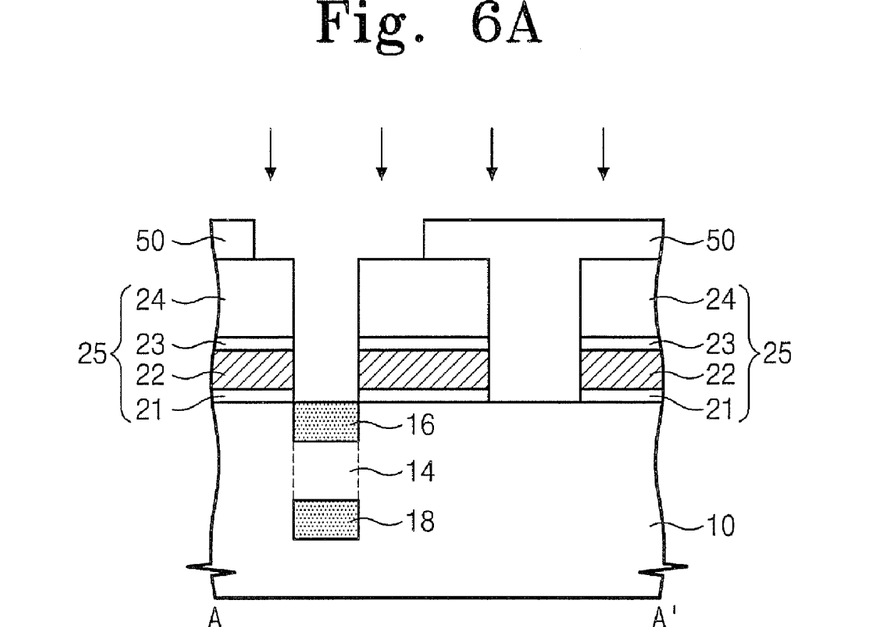

Referring now to FIGS. 4A and 4B, a photoresist pattern 50 can be arranged on the substrate 10. The photoresist pattern 50 can cover all the exposed regions of the substrate 10, except regions where the source lines 18 are formed. Using the photoresist pattern 50 as an ion implantation mask, impurities can be injected to form the impurity regions 15 at positions corresponding to the source regions (refer to 16 of FIG. 6). The impurity regions 15 can contain a material, e.g., germanium ions, capable of restraining diffusion of conductive impurities that are to be injected for the source lines in the subsequent step. Germanium atoms are able to easily penetrate silicon lattices and settle in the lattice structure of silicon. Germanium atoms also have high solid solubility and can restrain diffusion of impurities such as phosphorous (P) or arsenic (As), that can be used to form a shallow impurity region. In some embodiments, Germanium ions may be injected at an energy in the range of 10~150 KeV with concentration of approximately $5 \times 10^{13} \sim 10^{16}$ ions/cm$^2$. The impurity regions 15 of some embodiments can be formed at depths in the range of 200~500 Å.

Figure 5A:
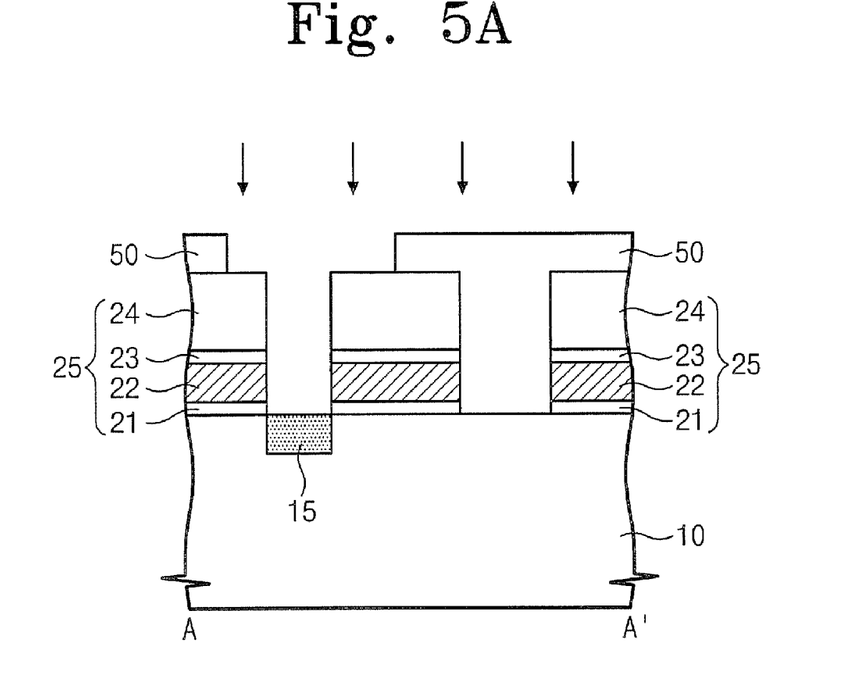
Figure 5B:
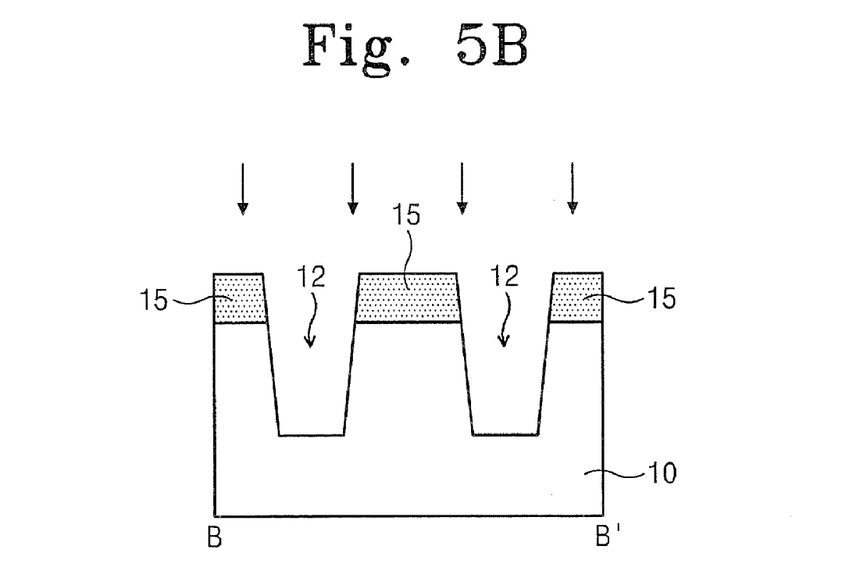

Referring now to FIGS. 5A and 5B, the photoresist pattern 50 can be used as an etch mask such that the field isolation films between the impurity regions 15 are etched to expose the trenches 12. In some embodiments, a dry etch mode using plasma can also be used. Although not shown, while etching the field isolation films 11, the tops of the control gates 24 that are not covered by the photoresist pattern can be partially etched.

Figure 6B:
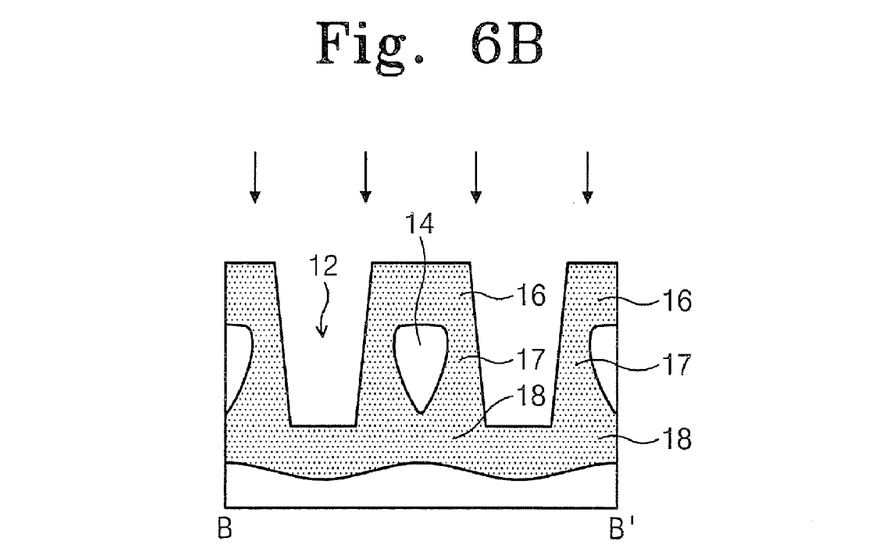

Referring to FIGS. 6A and 6B, the photoresist pattern 50 can be used as an ion implantation mask and impurities can be injected to form the source lines 18. The source lines 18 can include the source regions 16 and the join regions 17 that connect the source regions 16 to each other. The join regions 17 link with each other under the source regions 16 and isolation regions 14 can be formed that are enclosed by the source regions 16 and the join regions 17.

The impurities injected may be phosphorous or arsenic ions and can be implanted at an energy in the range of 5~100 KeV with the concentration in the range of $10^{12} \sim 10^{16}$ ions/cm$^2$. In some embodiments, phosphorous ions can be used for fast diffusion as compared to that of arsenic ions. For example, while injecting phosphorous ions, the phosphorous ions are slowly diffused in the source regions 16 having the germanium ions, but are rapidly diffused in the join regions 17 without the germanium ions. Accordingly, the source regions 16 do not extend based on the injection whereas the join regions 17 rapidly extend to be connected with each other under the source regions 16. Further, since the phosphorous ions are injected along profiles of the trenches 12, the join regions 17 are able to link with each other at the bottoms of the trenches 12. In this manner, the resistance of the source lines can be significantly reduced in addition to preventing and/or reducing a short channel effect.

Figure 7A:
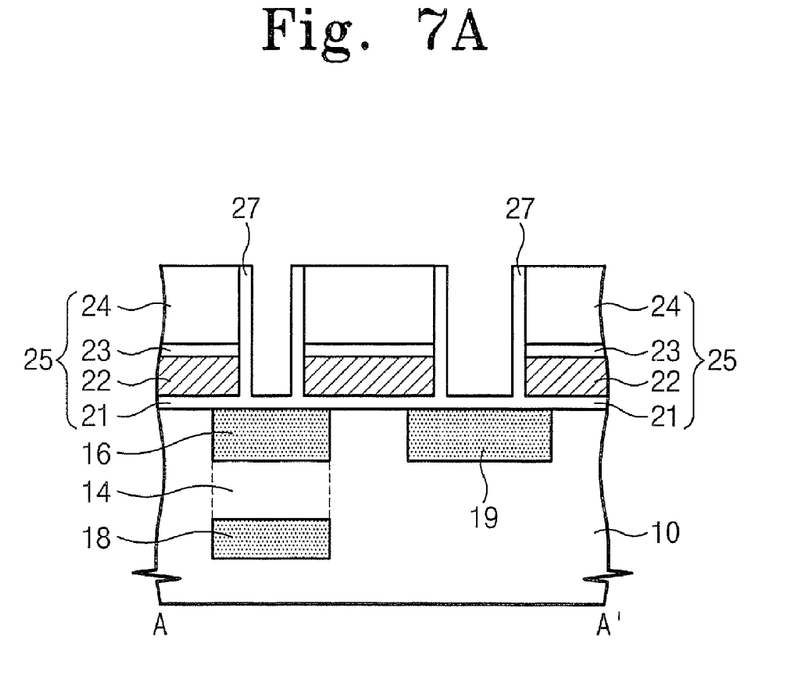
Figure 7B:
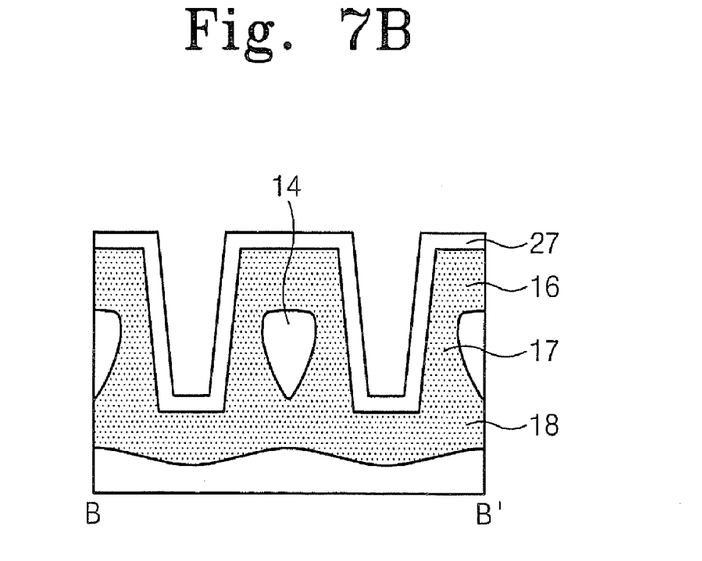

Referring now to FIGS. 7A and 7B, after the photoresist pattern 50 is removed, impurities are injected over the substrate to form the drain regions 19. For example, the injected impurities may be arsenic ions, that can be implanted at an energy in the range of 5~100 KeV with the concentration in the range of $10^{12} \sim 10^{16}$ ions/cm$^2$. The arsenic ions may be implanted into the source lines 18, which can further reduce the resistance of the source lines 18. This effect may be especially realized when phosphorous and arsenic ions are injected into the source lines together, which can have the effect of reducing the resistance further.

The protection film 27 can be deposited to cover the sidewalls of the gate structures 25, the source lines 18, and the drain regions 19. The protection film 27 may be formed using a thermal treatment in an oxygen enriched atmosphere. This thermal treatment can be carried out at temperatures in the range of 800~1000 degrees Celsius for a duration in the range of 1~100 minutes. During the deposition of the protective film 27, it may be beneficial to gradually increase the temperature in a nitrogen atmosphere before beginning the thermal treatment in a high-temperature oxygen atmosphere. In this manner, the formation of the protection film 27 can be stabilized.

Spacers 29 can be formed that cover the sidewalls of the gate structures 25. The spacers 29 may be formed of silicon nitride. Since intervals between the gate structures 25 are very narrow, the source lines 18 can also be covered by the spacers 29.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A nonvolatile memory device comprising:
   a field isolation film configured to define a plurality of active regions in a substrate;
   a wordline that intersects the plurality of active regions;
   a source region and a drain region that are formed in each of the active regions at both sides of the wordline;
   a source line that extends along the wordline under the source region;
   a join region that connects the source region with the source line; and
   an isolation region that is enclosed by the source region, the join region and the source line,
   wherein the isolation region is disposed in the active regions under the source region.

2. The nonvolatile memory device of claim 1, wherein the source line comprises a bottom that is lower than a bottom of the field isolation film.

3. The nonvolatile memory device of claim 1, wherein the source region comprises at least two types of impurities.

4. The nonvolatile memory device of claim 1, wherein the source region comprises a first quantity of types of impurities, wherein the source line comprises a second quantity of types of impurities, and wherein the first quantity is different from the second quantity.

5. The nonvolatile memory device of claim 1, wherein the source region comprises germanium ions and the source line excludes germanium ions.

6. The nonvolatile memory device of claim 1,
   wherein the source region comprises a first type of impurity and a second type of impurity, and the source line comprises the second type of impurity,
   wherein the first type of impurity and the second type of impurity are different from each other, and
   wherein the first type of impurity reduces diffusion of the second type of impurity.

7. A nonvolatile memory device comprising:
   field isolation films configured to define pluralities of active regions in a substrate;
   pluralities of wordlines configured to intersect the active regions and the field isolation films;
   source and drain regions that are formed in each of the active regions at both sides of the wordlines;
   source lines configured to extend along the wordlines under the source regions at sides of the wordlines;
   join regions configured to connect the source regions with the source lines; and
   isolation regions that are enclosed by the source regions, the join regions and the source lines,
   wherein the isolation regions are disposed in the active regions under the source regions.

* * * * *